United States Patent [19]

Swamy

[11] Patent Number: 5,400,220

[45] Date of Patent: Mar. 21, 1995

[54] MECHANICAL PRINTED CIRCUIT BOARD AND BALL GRID ARRAY INTERCONNECT APPARATUS

[75] Inventor: Deepak Swamy, Austin, Tex.

[73] Assignee: Dell USA, L.P., Austin, Tex.

[21] Appl. No.: 245,410

[22] Filed: May 18, 1994

[51] Int. Cl.⁶ .......................... H05K 7/02; H05K 3/30
[52] U.S. Cl. ..................... 361/760; 174/260; 174/261; 174/264; 174/266; 257/692; 257/780; 257/774; 361/773; 361/736; 361/752; 437/209; 29/832; 29/837; 29/845; 29/884
[58] Field of Search ............... 257/774, 778, 779–781, 257/784, 786, 690, 692; 174/260–267; 361/760–764, 772–774, 792, 796, 728–730, 736, 752; 29/832, 837, 845, 884; 437/209

[56] References Cited

U.S. PATENT DOCUMENTS

| | | |
|---|---|---|
| 4,511,757 | 4/1985 | Ors et al. ............................. 428/901 |
| 4,598,167 | 7/1986 | Ushifusa et al. ....................... 501/66 |
| 4,940,181 | 7/1990 | Juskey, Jr. et al. ................... 174/263 |
| 5,237,485 | 8/1993 | Cognetti de Martiis et al. ... 361/712 |

*Primary Examiner*—Bot Ledynh
*Attorney, Agent, or Firm*—J. Richard Konneker; James Huffman

[57] ABSTRACT

To facilitate the registered connection between a ball grid array package and an associated multi-tiered circuit board, a spaced series of vias are formed transversely through the board substrate between its opposite first and second sides. A spaced series of relatively shallow, circularly cross-sectioned socket areas, offset from the vias, are also formed on the first side of the circuit board. The sockets have diameters slightly larger that those of the generally ball-shaped leads of the BGA package, and are positioned on the same centerline pattern as the leads. After the vias and sockets are formed, a multi-layer metallic coating is deposited on their interiors and around their open ends on the first board side, with the coating being extended across the first board side between associated socket and via pairs. Using a high precision pick and place machine, the BGA package is placed against the first board side in a manner causing the BGA leads to partially enter the plated sockets, the sockets facilitating the registration between the BGA leads and the lead connection areas of the metallic coating. A resilient clamping structure is then used to releasably hold the BGA leads in their associated metal-coated sockets.

23 Claims, 4 Drawing Sheets

MECHANICAL PRINTED CIRCUIT BOARD AND BALL GRID ARRAY INTERCONNECT APPARATUS

BACKGROUND OF THE INVENTION

The present invention relates generally to circuit board construction, and more particularly relates to apparatus and methods for operatively connecting an electronic component ball grid array ("BGA") to a circuit board.

For many years it has been customary to employ printed circuit boards ("PCBs") or printed circuit assemblies ("PCAs") as mediums for mechanically holding electronic components together and providing operative electrical interconnections between the components. The earliest PCBs were constructed of an insulating planar substrate (such as a glass fiber/resin combination) upon which a layer of conductive metal was deposited. The metal coating layer typically covered the entire surface of the substrate and was subsequently etched by a chemical process to form from the initial metal coating layer a predetermined pattern of conductive "traces" on the side surface of the substrate. Often, these electrically conductive traces were formed on both sides of the substrate to allow conductors to cross without coming into contact with one another. A plurality of mounting holes or "vias" were drilled through the metal layer(s) and the substrate, and were appropriately positioned to receive leads from the electronic components. This method of mounting electrical components on a circuit board is commonly referred to as "through-hole" mounting.

To complete assembly of a circuit board, the electronic components were placed on the PCB, either by hand or robotic machine, with the leads of the components passing through corresponding vias. Finally, solder connections were made to ensure reliable electrical contact between the components and the traces.

Initially, soldering was performed manually. Subsequently, more efficient machine-soldering techniques employing infrared ovens or solder baths were developed to speed manufacture of circuit boards and to ensure higher solder joint reliability. Under such machine-soldering techniques, the PCB and its components were heated while solder, under the influence of flux, was caused to contact the board and flow by capillary action into the vias, yielding a low resistance solder joint when cooled.

As circuit board technology developed, designers began to create circuit boards comprising many alternating substrate and conductive layer pairs, resulting in sandwiched circuit boards that could accommodate a higher component density. Such boards could accommodate ten or more conductive layers. Later, surface-mount technology allowed the leads to be soldered to solder pads on the surface of the circuit board, rather than requiring the leads to pass through vias to be soldered therein.

In addition to this circuit board construction evolution, the electronic components themselves underwent changes to accommodate higher density. First, discrete components were combined into integrated circuits ("ICs"). ICs were originally placed in dual in-line packages ("DIPs") each consisting of an elongated plastic body encapsulating the IC and a plurality of electrical leads coupled to the IC and arranged in a series extending from the two long edges of the body. The leads could either be through-hole soldered or surface-mounted. Unfortunately, the number of leads that a DIP could accommodate was a function of twice the length of the DIP body edges. Some improvement was made by providing packages having leads extending from all four edges of the body, but, even so, the number of leads was a function of the perimetral length of the body edges.

Next, in an effort to increase lead density further (to address, in particular, the increasing power and density of microprocessors and the stringent space requirements of notebook, subnotebook and personal digital assistant ("PDA") computers), designers developed quad flat packs ("QFPs") comprising a generally square body having leads extending downward from the lower surface of the body. The leads were typically arranged in multiple rows and columns, allowing the QFPs to accommodate more pins than DIPs. However, limitations in socket size and collective lead insertion force began to be problematical.

Currently, designers are focussing on ball grid array ("BGA") packaging wherein leads are dispensed with and replaced with a finely-pitched matrix of conductive contact surfaces on the lower surface of an otherwise conventional body. The circuit board to which a BGA package is to be mounted is conventionally provided with a matrix of corresponding surface mounted flat pad structures upon each of which is deposited a small quantity of solder. To mount the BGA package to the circuit board, the BGA package is temporarily clamped to the board and the board heated (typically by application of infrared energy), causing the solder to melt, fusing the corresponding surfaces together and yielding a strong mechanical and electrical connection when cooled.

BGA packaging is proving to be a powerful ally in the further miniaturization of computers. However, the circuit boards designed to receive the BGAs are lagging in compactness. The problem centers on how to route the electrical conductors from each BGA pad through the circuit board.

In multi-layer boards, electrical signals are routed from layer to layer by metal-coated vias. Accordingly, a via is required for each pad to communicate electrical signals between the pad to a trace on another layer of the board. At the present time, most conventional circuit board designs employ a matrix of vias that are spatially offset from the matrix of electrically conductive flat surface pads and coupled thereto by short traces.

In connecting a BGA electronic component package to the circuit board, the BGA package is typically placed on the appropriate side of the circuit board, using a high accuracy "pick and place" machine, in a manner such that the ball shaped lead portions of the BGA package contact the flat, surface mounted solder pads. The partially completed circuit board/BGA package structure is them subjected to an infrared solder reflow process to mechanically and electrically couple the surface pads to the ball shaped lead portions of the BGA package.

Despite the fact that the ball-shaped configurations of the BGA lead portions allows for a certain degree of self-centering due to surface tension during the solder reflow process, there are practical limitations to the maximum tolerable centering offset between the pads and BGA leads. Additionally, this desirable self-centering effect provided by the ball-shaped configuration of the BGA lead portions tends to be substantially diminished by even slight nonplanarities in either or both of the circuit board and BGA package. These positioning offset and planarity problems, of course, tend to significantly increase the probability of having to rework a significant portion of the fabricated circuit board/BGA package assemblies, thereby undesirably increasing assembly yield and cost.

In addition, as is well known in the circuit board art, BGA packages that are soldered onto printed circuit boards using standard surface mount technology are difficult to rework. Moreover, the fact that these soldered BGA package structures as a practical matter cannot be removed by the end-user precludes this surface mount solder technology from being utilized to package devices that have an upgrade path.

As can readily be seen from the foregoing, it would be highly desirable to provide improved apparatus and methods for operatively connecting a BGA electronic component structure to a circuit board in a manner eliminating or at least substantially reducing the above-mentioned problems, limitations and disadvantages typically associated with conventional solder connection apparatus and methods. It is thus an object of the present invention to provide such improved connection apparatus and methods.

SUMMARY OF THE INVENTION

In carrying out principles of the present invention, in accordance with a preferred embodiment thereof, a circuit board is provided with improved apparatus for operatively connecting the circuit board to a BGA package. The circuit board includes a substrate structure having first and second opposite sides. A spaced series of vias extend transversely through the substrate structure between its opposite first and second sides, and a spaced series of socket areas are offset from the vias and extend only partially through the substrate structure from its first side. The vias and socket areas are preferably formed by a precision drilling process.

An electrically conductive metal coating is deposited on the interiors of the vias and the socket areas and around their open ends of the first substrate side. Mutually spaced portions of the metallic coating extend across the first substrate side between associated via/socket area pairs to electrically couple them. Preferably, the metallic coating has a multi-layer structure in which the inner layer is copper, the outer layer is gold, and an intermediate nickel layer is interposed between the copper and gold layers. The coating is representatively formed by an etching process in which gold is used as the etch resist material. The metallically coated socket areas are relatively oriented to partially receive a spaced array of generally ball-shaped lead portions externally disposed on the BGA package to be operatively connected to the circuit board.

To attach the BGA package to the circuit board, the BGA package is positioned along the first substrate side, with the BGA lead portions extending partially into and engaging the metal coating portions of the socket areas. Holding means are provided for exerting a resilient force on the BGA package in a manner releasably holding its lead portions in engagement with the metallic coating of their associated socket areas.

In a representative preferred embodiment thereof, the holding means include first and second elastomeric pad members respectively positioned against the outer side of the BGA package and the second side of the substrate structure, a resiliently compressible spring plate structure positioned against the outer side of the first elastomeric pad member, a rigid backing plate member positioned against the outer side of the second elastomeric pad member, and a series of clamping bolts secured between the spring plate structure and the backing plate and tightened to compress the first and second elastomeric pad members and the spring plate structure.

The socketed configurations of the BGA connection portions of the circuit board substantially facilitate an automatic registry between the BGA lead portions and such connection portions during the initial placement of the BGA package on the circuit board substrate. The socket areas further act to inhibit shifting of the installed BGA package relative to the circuit board substrate while clamped thereto by the holding means. The releasable clamping of the BGA package to the circuit board substrate permits the BGA package to be easily removed for repair, replacement or upgrade purposes.

DETAILED DESCRIPTION

Figure 1:
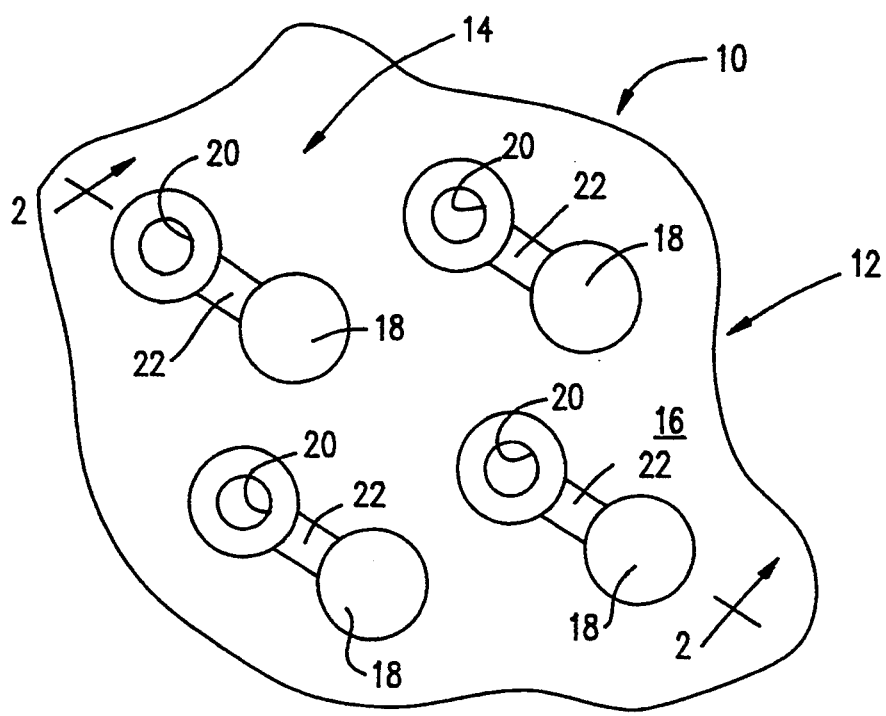
FIG. 1 (PRIOR ART) is a top plan view of a portion of a conventional circuit board having offset arrays of electrically coupled vias and flat, surface mounted solder pads formed thereon.

Illustrated in top plan view in FIG. 1 (PRIOR ART) is a portion of a representative circuit board 10 having a substrate portion 12 with conventional ball grid array ("BGA") connection circuitry 14 formed on a side surface 16 thereof. The connection circuitry 14 includes a spaced array of circular solder pads 18 that are offset from a corresponding spaced array of metallically lined vias 20 and electrically coupled thereto by a series of interstitial electrically conductive surface traces 22.

Figure 2:
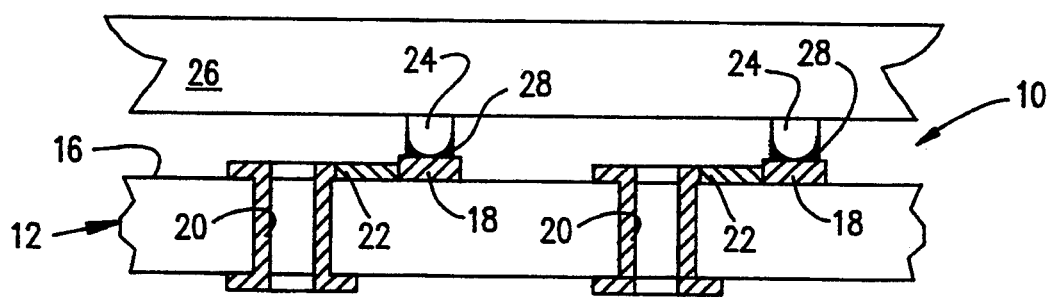
FIG. 2 (PRIOR ART) is a cross-sectional view through the circuit board taken along line 2—2 of FIG. 1.

The pads 18, as illustrated in FIG. 2 (PRIOR ART) are used as circuit board connection areas for the generally ball-shaped lead portions 24 depending in a mutually spaced, finely-pitched array from the underside of a representative BGA package 26 and arranged to be registrable with the pads 18 on the circuit board substrate 12. Using a high accuracy pick and place machine (not shown), the package 26 is positioned against the circuit board in a manner such that the ball-shaped leads 24 engage the top sides of the metallic solder pads 18. A conventional IR solder reflow process is used to solder the BGA leads 24 to the underlying surface mounted pads 18 as at 28.

While the use of the ball-shaped leads 24 provides a small degree of self-centering of the leads 24 on their associated solder pads 18, this self-centering characteristic of the BGA/surface pad connection structure tends to be for the most part defeated by even relatively minor planarity disparities between the top surfaces of the pads 18 and the undersides of the ball shaped BGA leads 24.

Figure 3A:
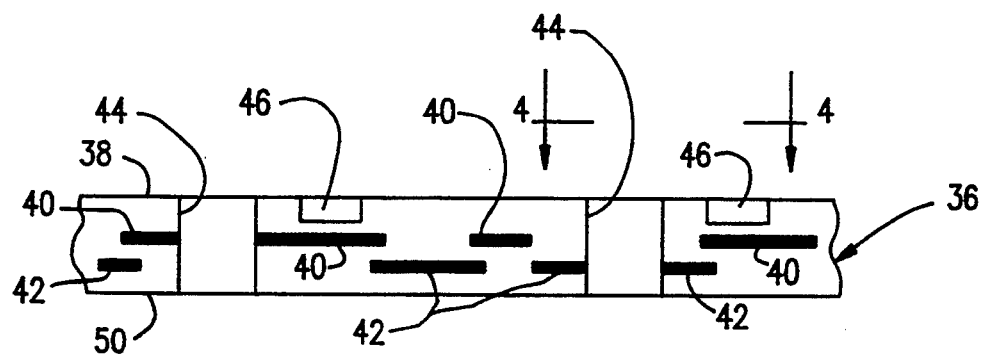
FIGS. 3A–3C are simplified cross-sectional views through an improved circuit board embodying principles of the present invention and sequentially illustrating the construction of the board and the operative connection of BGA electronic component structure thereto.
Figure 3B:
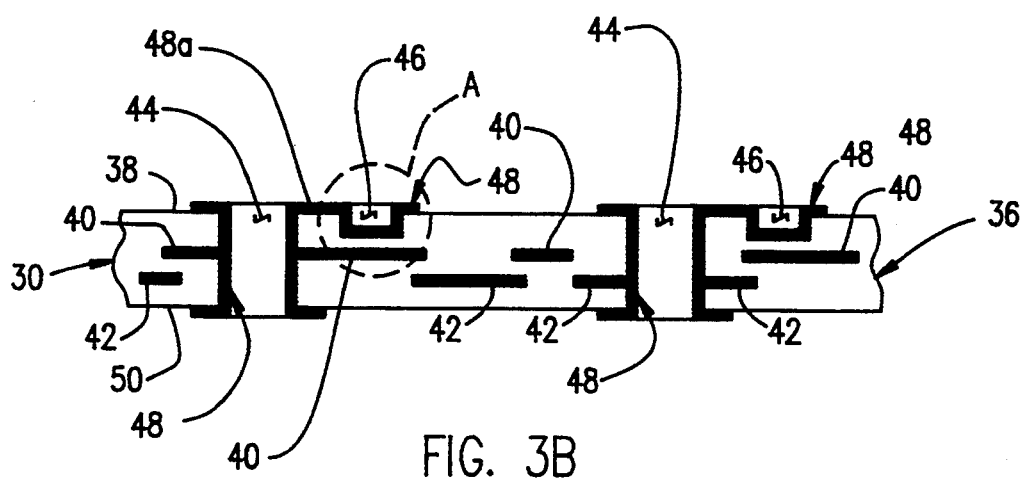
Figure 3C:
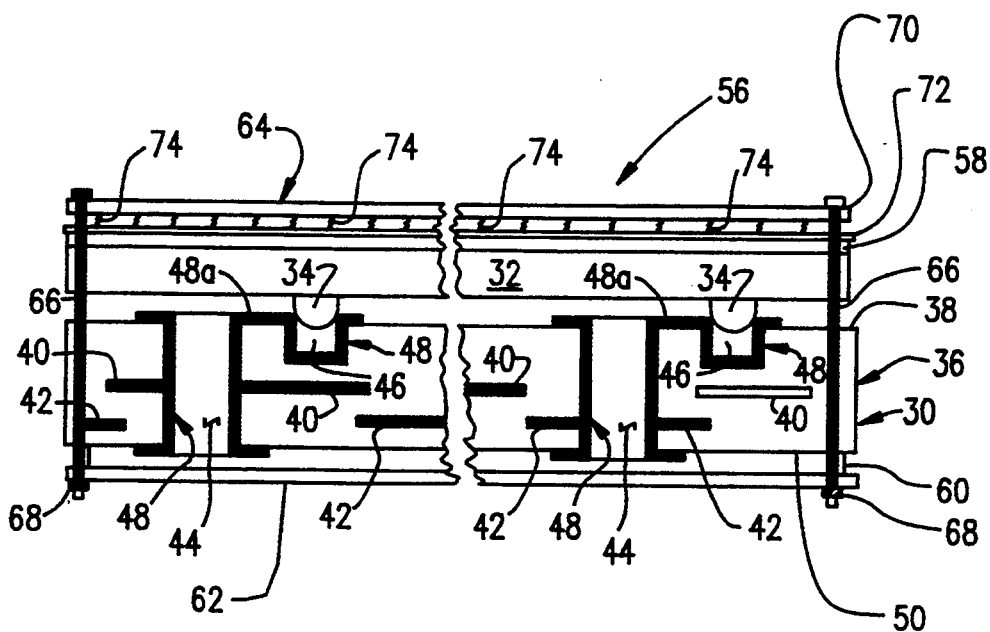
Figure 4:
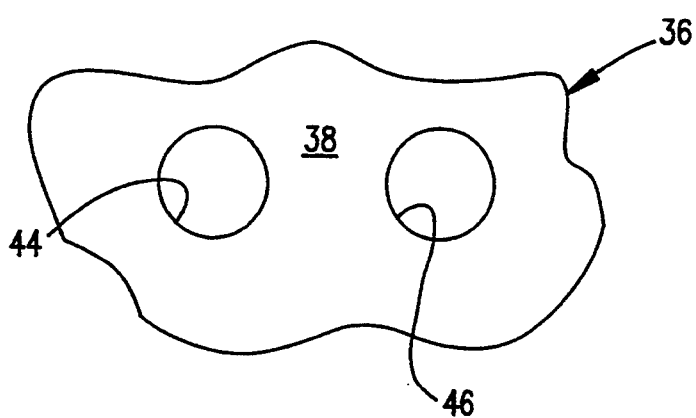
FIG. 4 is a top plan view of a portion of the partially completed circuit board taken along line 4—4 of FIG. 3A.

FIGS. 3A–3C sequentially illustrate the formation of an improved circuit board 30 (see FIGS. 3B and 3C) and the operative releasable mechanical connection of the completed circuit board 30 to a representative BGA package 32 having a mutually spaced array of ball-shaped lead portions 34 depending from its underside. As will be seen, a unique configuration of the BGA connection portion of the circuit board 30 serves as registration means for facilitating the proper alignment between the BGA leads 34 and the associated connection portion of the circuit board 30.

Referring now to FIG. 3A, the fabrication of the improved circuit board 30 is begun by forming an insulative substrate member 36 that has a top side 38. Representatively, the substrate member 36 is of a laminated construction in which a plurality of interior "tiers" of circuitry portions 40,42 are operatively disposed. After the formation of the laminated substrate member 36, a spaced series of circularly cross-sectioned vias 44 are formed transversely through the substrate member, between its opposite sides, using precision drilling apparatus. As illustrated, the vias 44 are positioned to intersect facing end sections of selected interior circuit portions 40 and 42.

With the same precision drilling apparatus used to form the vias 44 a spaced series of relatively shallow, circularly cross-sectioned sockets 46 are formed in the top side 38 of the substrate structure 36. The sockets 46 have diameters just slightly larger than the diameters of the BGA lead members 34, are offset from the vias 44, and are positioned on centerlines registrable with the centerlines of the BGA lead members 34.

Figure 5:
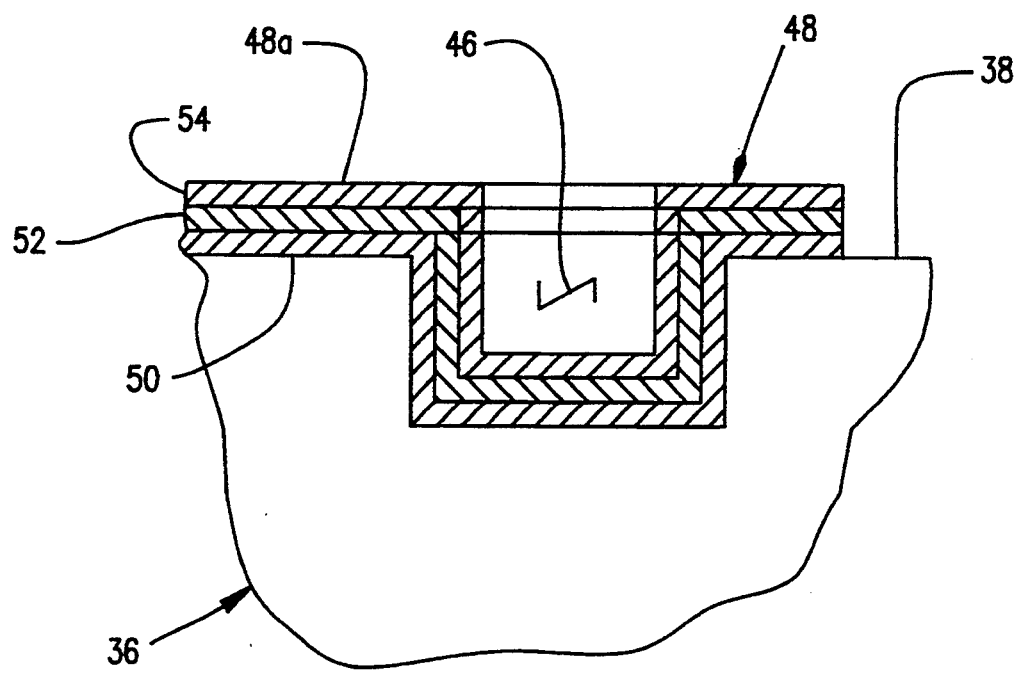
FIG. 5 is an enlargement of the circled area "A" in FIG. 3B.

Next, as illustrated in FIGS. 3B and 5, the interiors of each via 44 and its associated adjacent socket 46 are plated with a metallic coating generally denoted by the reference numeral 48. The metallic coating 48 preferably comprises a layer of copper 50 (see FIG. 5) deposited directly on the indicated substrate structure surfaces, a layer of nickel 52 deposited on the outer side of the copper layer 50, and a layer of gold 54 deposited on the outer side of the nickel layer 52. The copper and nickel layers 50,52 are deposited on the substrate structure using a conventional outer layering process. During the final pattern plating, the gold layer 54 is used as the etch resist in place of the conventionally utilized solder (Sn/Pb).

In the finished circuit board 30, this creates a gold outer side contact surface on the overall metallic coating 48 which, in a manner subsequently described, is brought into contact with the BGA leads 34 to operatively couple the circuit board 30 to the BGA package 32. This permits the overall BGA connection apparatus formed integrally on the circuit board 30 to utilize the superior electrical contact surface finish and interconnection reliability properties of gold.

In addition to extending along the interior surfaces of the vias 44 and the sockets 46, the metallic coating 48 extends along the top side 38 of the substrate structure 36 at the open top ends of the vias 44 and the sockets 46, and along the bottom side 50 of the substrate structure 36 around the open bottom ends of the vias 40. Interstitial portions 48a of the coating structure 48 extend along the top substrate side 38 between the coating material of each via 44 and the coating material of its associated socket 46.

The fabrication of the overall circuit board/BGA package assembly shown in FIG. 3C is completed by positioning the BGA package 32 atop the circuit board substrate 36 (using a high accuracy pick and place machine) in a manner such that the BGA leads 34 register with the plated sockets 46 and partially enter them as illustrated in FIG. 3C. The BGA package 32 is then mechanically and releasably held in place on the circuit board 30, in a manner permitting the BGA package 32 to be easily removed for replacement and upgrade purposes, using a specially designed resilient clamping structure 56 which will now be described in conjunction with FIGS. 3C and 6.

Resilient clamping structure 56 includes upper and lower elastomeric pads 58,60 respectively placed along the top side of the BGA package 32 and along the bottom side 50 of the substrate structure 36; a rigid rectangular backing plate 62 extending along the underside of the lower elastomeric pad 60; a rectangular spring plate structure 64 positioned atop the upper elastomeric pad 58, and four elongated clamping bolt members 66 extending through facing corner openings in the backing plate 62 and the spring plate structure 64 and threaded into retaining nuts 68.

The spring plate structure 64 includes vertically spaced upper and lower parallel rigid plate members 70 and 72 which are in a facing relationship and are movable toward and away from one another. Sandwiched between the plate members 70,72 are a spaced series of vertically oriented coiled compression spring members 74 that are fixed at their upper and lower ends to the facing interior side surfaces of the plates 70,72. After the BGA package 32 is positioned atop the substrate structure 36, with the leads 34 in registry with and partially received in the plated sockets 46, the resilient clamping structure 56 is assembled as shown in FIG. 3C and the bolts 66 tightened into the associated nuts 68 in a manner at least partially compressing the springs 74 between the plates 70 and 72 to thereby compress the elastomeric pads 58,60 and resiliently and releasably hold the BGA leads 34 against and in electrical contact with the metallic coating portions of their associated sockets 46.

The use of the spring plate structure 64 compensates for any lateral "relaxation" that may occur in the elastomeric pads 58,60 over time that would tend to undesirably lessening the retaining force on the BGA leads 34 that keeps them in registry and partially received in their associated sockets 46. When such elastomeric pad relaxation occurs, the compressed springs 74 simply expand a bit and automatically drive the plate 72 inwardly toward the sockets 46 to maintain sufficient clamping force on the BGA leads 34.

Figure 6:
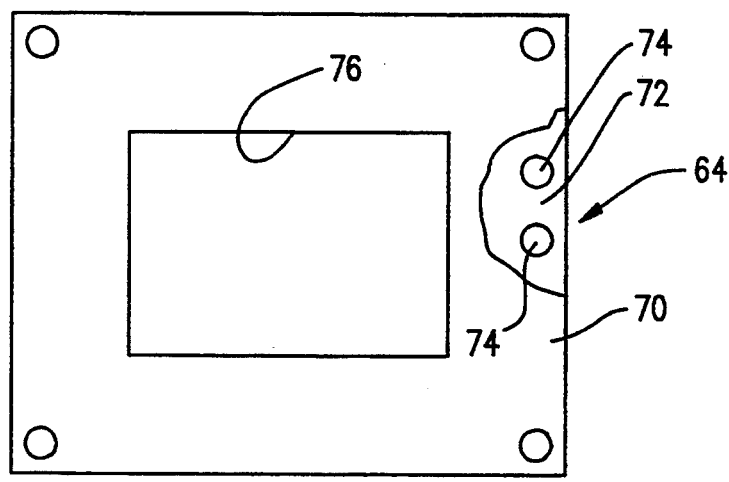
FIG. 6 is a reduced scale, partially cut away top plan view of a spring clamp structure shown in FIG. 3.

As illustrated in FIG. 6, the plates 70 and 72 (as well as the elastomeric pad 58) preferably have aligned central rectangular cutout areas 72 formed therein that overlie a central top side portion of the BGA package 32 in the completed circuit board/BGA package assembly. This cutout area corresponds with the non-I/O area of the typical BGA package (such as a processor) and may conveniently be used to receive a suitable heat sink device (not shown) operatively connected to the top side of the BGA device 32.

The use of the plated socket areas 46 in conjunction with the generally ball-shaped lead portions 34 of the BGA package provide a substantial degree of self-alignment between the BGA package 32 and the circuit board substrate 36 during initial placement of the BGA package on the substrate structure. Additionally, the use of the resilient clamping structure 56 maintains the BGA lead portions 34 in firm contact with the metal plating portions of their associated socket areas 46 yet permits the BGA package 32 to be quickly removed and replaced if desired.

The partial receipt of the BGA lead portions 34 in the plated socket areas 46 serves to prevent shifting of the mechanically clamped lead portions 34 out of their socket areas 46 in a direction parallel to the top side 38 of the substrate portion 36. Further, the outer gold layer 54 on the socket area plating structures 48 provides superior electrical contact characteristics between the leads 34 and the plating structures of the socket areas 46.

While the overall circuit board/BGA package assembly shown in FIG. 3C has been shown with a BGA package mounted on its top side, it will be readily appreciated that plated socket areas could also be formed on the bottom side 50 of the substrate 36 and used in conjunction with one or more additional BGA packages mounted on the bottom substrate side and held in place with the resilient clamping structure 56. In such case, an additional spring plate structure 64 could be used in place of the bottom backing plate 62.

The foregoing detailed description is to be clearly understood as being given by way of illustration and example only, the spirit and scope of the present invention being limited solely by the appended claims.

What is claimed is:

1. Circuit board apparatus comprising:
   a circuit board substrate structure having first and second opposite sides, said circuit board substrate structure having a spaced series of vias extending transversely therethrough between said first and second opposite sides, and further having a spaced series of socket areas offset from said spaced series of vias and extending only partially through said substrate structure from said first side thereof;
   a metallic coating deposited on the interiors of said vias and said socket areas and around their open ends on said first side of said substrate structure, portions of said metallic coating being extended across said first side between associated via/socket area pairs to electrically couple them;
   a ball grid array package having a spaced series of externally disposed, generally ball-shaped lead portions partially received in and releasably engaging the metallic coating of said socket areas; and
   holding means for exerting a resilient force on said BGA package in a manner releasably holding said lead portions in engagement with the metallic coating of their associated socket areas.

2. The circuit board apparatus of claim 1 wherein:
   said vias and said socket areas are drill holes.

3. The circuit board apparatus of claim 1 wherein:
   said metallic coating is a multi-layer metallic coating having a gold outer layer.

4. The circuit board apparatus of claim 1 wherein:
   said metallic coating is a multi-layer metallic coating having a copper inner layer, a gold outer layer, and a nickel intermediate layer.

5. The circuit board apparatus of claim 1 wherein:
   said substrate structure is of a laminated, multi-tier construction.

6. The circuit board apparatus of claim 1 wherein said BGA package has an outer side and said holding means include:
   a first elastomeric pad member positioned against said outer side of said BGA package,
   a spring plate structure having first and second rigid plate members disposed in a spaced apart, facing, parallel relationship, and a spaced series of compression spring members disposed between said first and second rigid plate members and operative to resiliently resist movement of said first and second rigid plate members toward one another, said first rigid plate member being positioned outwardly against said first elastomeric pad member, and
   clamping means for drawing said second rigid plate member toward said first rigid plate member in a manner compressing said spring members between said first and second rigid plate members and compressing said first elastomeric pad member between said first rigid plate member and said outer side of said BGA package.

7. The circuit board apparatus of claim 6 wherein said clamping means include:
   a second elastomeric pad member positioned against said second side of said substrate structure and having an outer side,
   a rigid backing plate member positioned against said outer side of said second elastomeric pad member, and
   a plurality of clamping bolt members interconnecting said first rigid plate member of said spring plate structure and said rigid backing plate member and exerting a force drawing said first rigid plate member and said rigid backing plate member toward one another.

8. The circuit board apparatus of claim 6 wherein:
   said first elastomeric pad member and said first and second rigid plate members have aligned central cutout areas therein.

9. The circuit board apparatus of claim 8 wherein:
   said aligned central cutout areas have rectangular configurations.

10. A method of fabricating circuit board apparatus comprising the steps of:
   providing a circuit board substrate structure having first and second opposite sides;
   forming in said substrate structure a spaced series of vias extending transversely therethrough between said first and second opposite sides;
   forming in said substrate structure a spaced series of socket areas offset from said spaced series of vias and extending only partially through said substrate structure from said first side thereof;
   depositing a metallic coating on the interiors of said vias and said socket areas and around their open ends on said first side of said substrate structure, portions of the deposited metallic coating extending across said first side between associated via/socket area pairs in a manner electrically coupling the pairs;
   providing a ball grid array package having a spaced series of externally disposed, generally ball-shaped lead portions;
   positioning said lead portions partially in said socket areas in engagement with the metallic coating portions thereof; and resiliently and releasably clamping said lead portions against the metallic coating of the socket areas that partially receive said lead portions.

11. Circuit board apparatus fabricated by the method of claim 10.

12. The method of claim 10 wherein:
said steps of forming spaced series of vias and socket areas are performed using a drilling process.

13. Circuit board apparatus fabricated by the method of claim 12.

14. The method of claim 10 wherein:
said depositing step is performed in a manner such that said metallic coating has a gold outer layer.

15. Circuit board apparatus fabricated by the method of claim 14.

16. The method of claim 14 wherein:
said depositing step is performed in a manner such that said metallic coating has a copper inner layer, and a nickel intermediate layer sandwiched between said copper inner layer and said gold outer layer.

17. Circuit board apparatus fabricated by the method of claim 16.

18. The method of claim 14 wherein:
said depositing step includes an etching process in which gold is used as the etch resist material.

19. Circuit board apparatus fabricated by the method of claim 18.

20. The method of claim 18 wherein said ball grid array package has an outer side and said resiliently and releasably clamping step includes the steps of:
positioning a first elastomeric pad member against said outer side of said ball grid array package, said first elastomeric pad member having an outer side,
providing a spring plate structure having first and second rigid plate members disposed in a spaced apart, facing, parallel relationship, and a spaced series of compression spring members disposed between said first and second rigid plate members and operative to resiliently resist movement of said first and second rigid plate members toward one another,
positioning said first rigid plate member against said outer side of said first elastomeric plate member, and
releasably forcing said second rigid plate member toward said first rigid plate member in a manner compressing said spring members and said first elastomeric pad member.

21. Circuit board apparatus fabricated by the method of claim 20.

22. The method of claim 20 wherein said releasably forcing step is performed by:
positioning a second elastomeric pad member against said second side of said substrate structure, said second elastomeric pad member having an outer side,
positioning a rigid backing plate member against said outer side of said second elastomeric pad member,
securing a plurality of elongated threaded clamping members between said second rigid plate member and said rigid backing plate member, and
tightening said threaded clamping members to draw said second rigid plate member and said rigid backing plate member toward one another.

23. Circuit board apparatus fabricated by the method of claim 22.

* * * * *